United States Patent
Kimura

(10) Patent No.: US 11,387,753 B2
(45) Date of Patent: Jul. 12, 2022

(54) SEMICONDUCTOR INTEGRATED CIRCUIT, SEMICONDUCTOR INTEGRATED CIRCUIT DEVICE, AND MOTOR-DRIVE CONTROL SYSTEM

(71) Applicants: Kabushiki Kaisha Toshiba, Tokyo (JP); Toshiba Electronic Devices & Storage Corporation, Tokyo (JP)

(72) Inventor: Hideki Kimura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 336 days.

(21) Appl. No.: 16/788,646

(22) Filed: Feb. 12, 2020

(65) Prior Publication Data
US 2021/0091691 A1 Mar. 25, 2021

(30) Foreign Application Priority Data
Sep. 19, 2019 (JP) .............................. JP2019-170534

(51) Int. Cl.
 *H02P 5/00* (2016.01)
 *H02P 6/28* (2016.01)
 *H02P 6/08* (2016.01)
 *H03K 17/687* (2006.01)

(52) U.S. Cl.
 CPC ................ *H02P 6/28* (2016.02); *H02P 6/08* (2013.01); *H03K 17/687* (2013.01)

(58) Field of Classification Search
CPC ...... H02P 6/28; H02P 6/08; H02P 8/12; H02P 27/085; H03K 17/687; H02M 1/088; H02M 7/003; H01L 23/3677
See application file for complete search history.

(56) References Cited

U.S. PATENT DOCUMENTS

| | | | | |
|---|---|---|---|---|
| 5,455,521 A | * | 10/1995 | Dobbelaere ...... | H03K 19/01721 326/86 |
| 5,469,095 A | * | 11/1995 | Peppiette ............... | G11B 5/022 327/309 |
| 5,642,247 A | * | 6/1997 | Giordano ............. | H02H 7/0838 318/434 |
| 5,778,703 A | * | 7/1998 | Imai ........................ | D06F 34/10 68/12.02 |
| 5,969,919 A | | 10/1999 | Kobayashi et al. | |

(Continued)

FOREIGN PATENT DOCUMENTS

| JP | 08-336295 A | 12/1996 |
|---|---|---|
| JP | 2005-079421 A | 3/2005 |

(Continued)

*Primary Examiner* — Muhammad S Islam
(74) *Attorney, Agent, or Firm* — Allen & Overy LLP

(57) ABSTRACT

A semiconductor integrated circuit includes a control circuit that supplies, in accordance with a drive mode, drive signals to first to fourth switching elements connected to first and second output ends that supply excitation current and a power source and a ground therebetween, and the drive mode includes a discharge mode that turns ON the first and third switching elements on the power source side and a discharge mode that turns ON the second and fourth switching elements on the ground side.

20 Claims, 10 Drawing Sheets

(56) References Cited

U.S. PATENT DOCUMENTS

| | | | | |
|---|---|---|---|---|
| 6,369,538 B1* | 4/2002 | Youn | ................... | D06F 34/08 |
| | | | | 68/12.02 |
| 7,057,361 B2* | 6/2006 | Kitahata | ............... | H02M 5/458 |
| | | | | 318/440 |
| 7,408,313 B1* | 8/2008 | Kong | ................... | G11B 5/022 |
| | | | | 318/560 |

FOREIGN PATENT DOCUMENTS

| JP | 2005-150454 A | 6/2005 |
|---|---|---|
| JP | 3665565 B2 | 6/2005 |
| JP | 3696384 B2 | 9/2005 |

\* cited by examiner

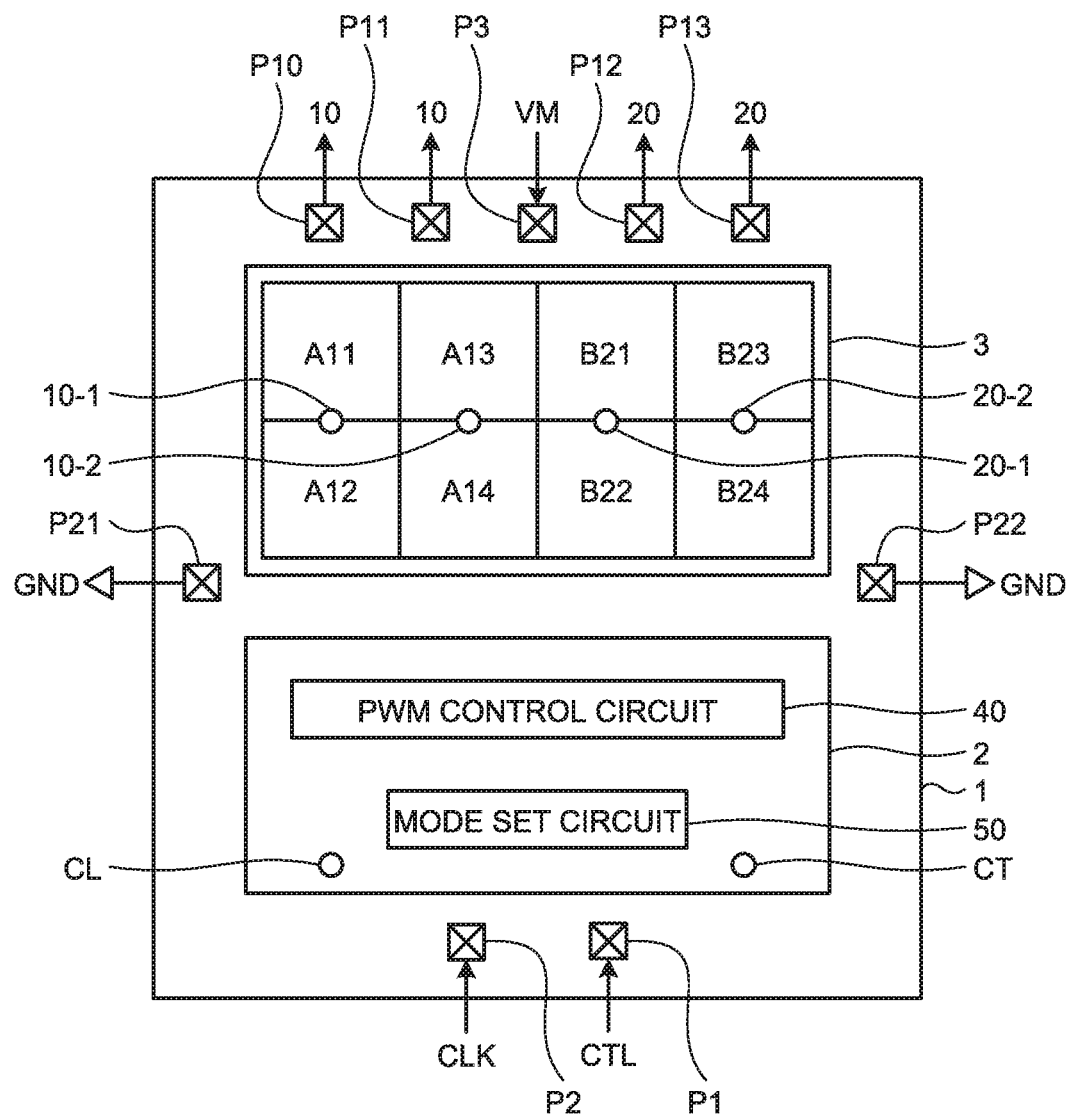

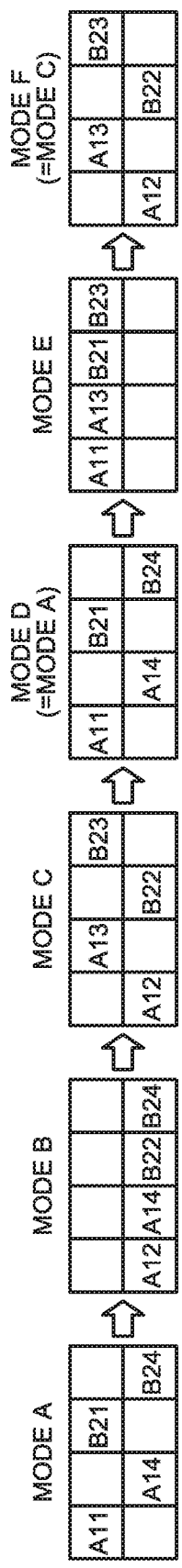

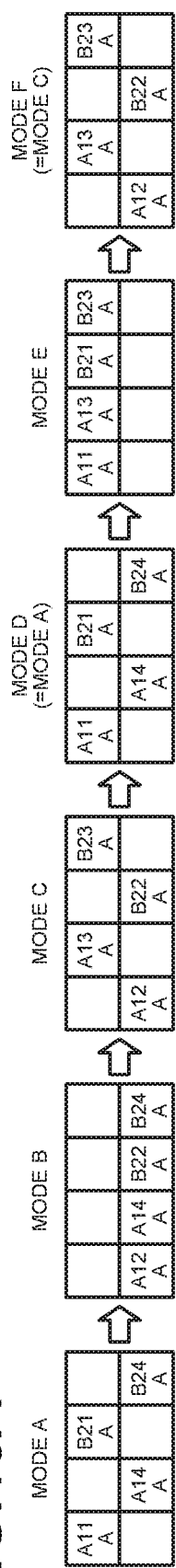
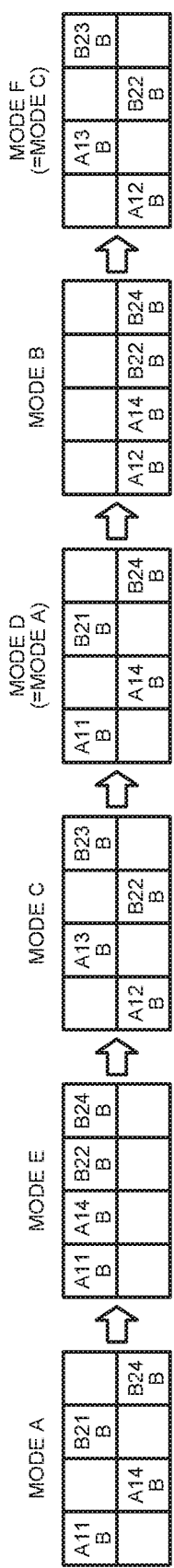
FIG.10A
FIG.10B
FIG.10C

SEMICONDUCTOR INTEGRATED CIRCUIT, SEMICONDUCTOR INTEGRATED CIRCUIT DEVICE, AND MOTOR-DRIVE CONTROL SYSTEM

CROSS-REFERENCE TO RELATED APPLICATIONS

This application is based upon and claims the benefit of priority from Japanese Patent Application No. 2019-170534, filed on Sep. 19, 2019; the entire contents of which are incorporated herein by reference.

FIELD

Embodiments described herein relate generally to a semiconductor integrated circuit, a semiconductor integrated circuit device, and a motor-drive control system.

BACKGROUND

Conventionally, there has been disclosed a semiconductor integrated circuit including an H-switch that performs charge, discharge, and low-speed discharge on current for an exciting coil of a motor. The charge, discharge, and low-speed discharge are controlled by turning ON/OFF of a switching element constituting the H-switch. The switching element in an ON-state generates heat due to current flowing through its on-resistance. Functions of the switching element may be deteriorated due to the generated heat. Furthermore, a life of the switching element is shorter as a time interval during which the switching element is exposed to heat is longer. Thus, there are desired a semiconductor integrated circuit, a semiconductor integrated circuit device, and a motor-drive control system capable of effectively dispersing generated heat.

BRIEF DESCRIPTION OF THE DRAWINGS

FIG. 2 is a diagram schematically illustrating a configuration of a semiconductor integrated circuit device with which the semiconductor integrated circuit according to the first embodiment is integrated;

FIGS. 4A and 4B are diagrams illustrating effects of the semiconductor integrated circuit according to the first embodiment;

FIGS. 10A to 10C are diagrams illustrating effects of the semiconductor integrated circuit device according to the second embodiment.

DETAILED DESCRIPTION

In general, according to one embodiment, a semiconductor integrated circuit includes: a first switching element whose main current path is connected to a first output end and a power end therebetween, wherein the first output end supplies excitation current to a first exciting coil of a motor; a second switching element whose main current path is connected to the first output end and a first grounding end therebetween; a third switching element whose main current path is connected to a second output end and the power end therebetween, wherein the second output end supplies excitation current to the first exciting coil of the motor; a fourth switching element whose main current path is connected to the second output end and the first grounding end therebetween; a mode set circuit that sets a drive mode of the first to fourth switching elements; and a control circuit that generates, in accordance with the drive mode, drive signals for controlling turning ON/OFF of the first to fourth switching elements, and supplies the generated drive signals to the first to fourth switching elements, wherein the drive mode includes: a first discharge mode that turns ON the first switching element and the third switching element; and a second discharge mode that turns ON the second switching element and the fourth switching element.

Exemplary embodiments of a semiconductor integrated circuit, a semiconductor integrated circuit device, and a motor-drive control system will be explained below in detail with reference to the accompanying drawings. The present invention is not limited to the following embodiments.

First Embodiment

Figure 1:
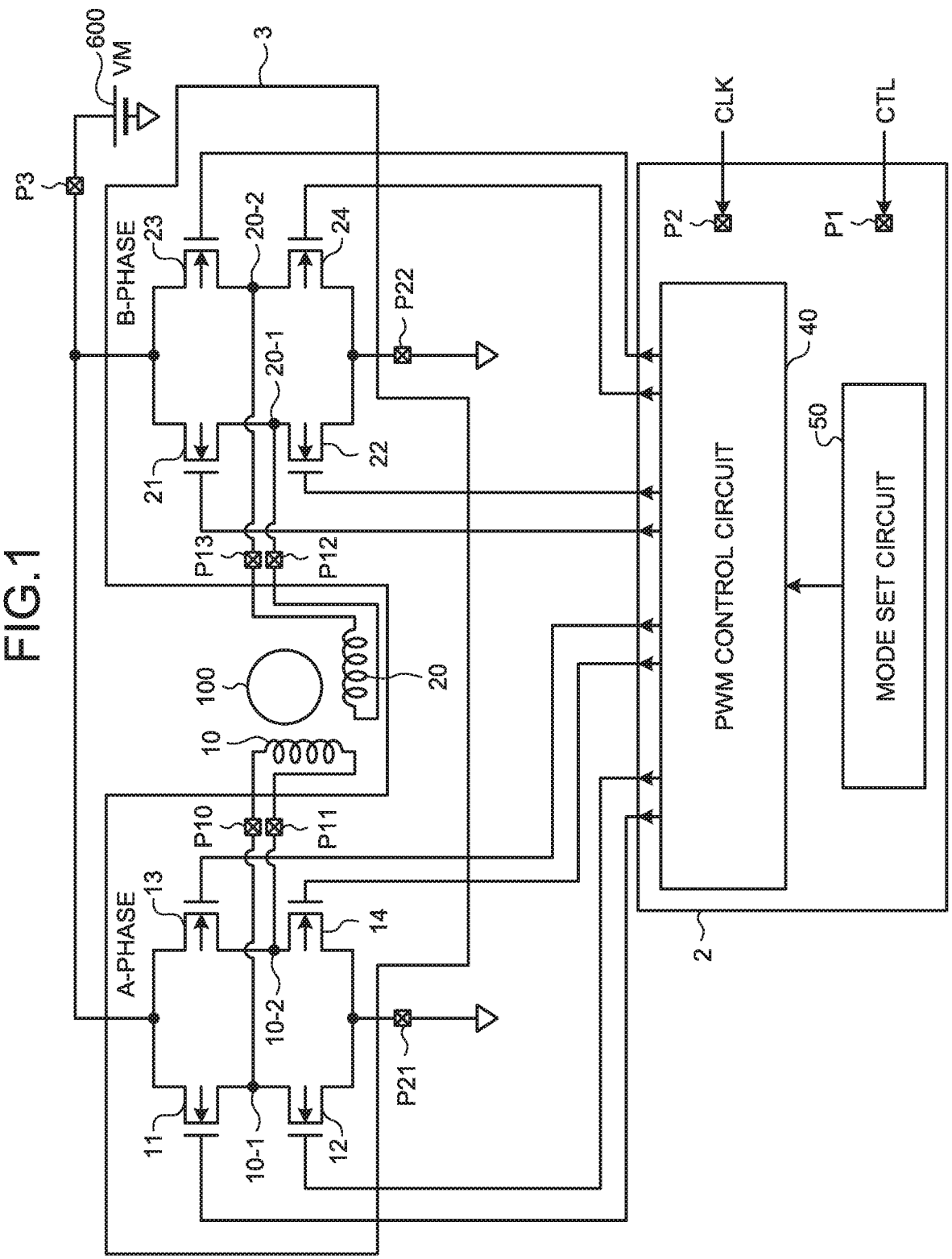
FIG. 1 is a diagram illustrating a semiconductor integrated circuit according to a first embodiment.

FIG. 1 is a diagram illustrating a semiconductor integrated circuit according to a first embodiment. The semiconductor integrated circuit according to the present embodiment includes an H-switch on A-phase (first-phase) side and an H-switch on B-phase (second-phase) side, so as to control drive of a motor. The motor includes an exciting coil 10, an exciting coil 20, and a rotor 100. The rotor 100 is controlled by magnetic field generated by the exciting coil 10 and the exciting coil 20.

The H-switch on A-phase side includes four NMOS transistors 11 to 14. Drains of the transistor 11 and the transistor 13 are connected to a pad P3. A voltage source 600 is connected to the pad P3, which supplies a voltage VM. Source-drain paths of the NMOS transistor 11 to 14 form a main current path. A source of the transistor 11 and a drain of the transistor 12 are connected to an output end 10-1. Sources of the transistor 12 and the transistor 14 are connected to a pad P21. The pad P21 is grounded. In other words, a source of the transistor 13 and a drain of the transistor 14 are connected to an output end 10-2. The output end 10-1 is connected to a pad P10, and the output end 10-2 is connected to a pad P11. The exciting coil 10 is connected to the pad P10 and the pad P11 therebetween. The output ends 10-1 and 10-2 output excitation current to be supplied to the exciting coil 10.

The H-switch on B-phase side includes four NMOS transistors 21 to 24. Drains of the transistor 21 and the transistor 23 are connected to the pad P3. Sources of the transistor 22 and the transistor 24 are connected to a pad P22. The pad P22 is grounded. A source of the transistor 21 and a drain of the transistor 22 are connected to an output end 20-1. A source of the transistor 23 and a drain of the transistor 24 are connected to an output end 20-2. The output end 20-1 is connected to a pad P12, and the output end 20-2 is connected to a pad P13. The exciting coil 20 is connected to the pad P12 and the pad P13 therebetween. The output ends 20-1 and 20-2 output excitation current to be supplied to the exciting coil 20.

PWM signals are supplied, from a Pulse-Width-Modulation (PWM) control circuit 40, to gates of the transistors 11 to 14 and gates of the transistors 21 to 24 constituting the respective H-switches. Turning ON/OFF of each of the transistors 11 to 14 and 21 to 24 is controlled by a corresponding PWM signal supplied from the PWM control circuit 40. Excitation currents flowing into the exciting coil 10 and the exciting coil 20 are controlled by turning ON/OFF of each of the transistors. For example, a PWM signal whose Duty is controlled in accordance with an excitation-waveform pattern of a pseudo-sine waveform is supplied to each of the transistors 11 to 14 and 21 to 24 so as to constitute a stepping motor.

A mode set circuit 50 sets a drive mode of the transistors 11 to 14 and 21 to 24. The drive mode includes a charge mode for charging the exciting coils 10 and 20, a high-speed discharge mode for discharging the exciting coils 10 and 20 at a high speed, and a low-speed discharge mode for discharging the exciting coils 10 and 20 at a low speed.

The mode set circuit 50 according to the present embodiment sets a mode (hereinafter, may be referred to as "U-mode") in which the transistors 11, 13, 21, and 23 on the voltage source 600 side are turned ON to discharge charges of the exciting coils 10 and 20 at a low speed, and a mode (hereinafter, may be referred to as "D-mode") in which the transistor 12, 14, 22, and 24 on a ground side are turned ON to discharge charges of the exciting coils 10 and 20. In the low-speed discharge, the U-mode and the D-mode are alternately executed so as to equalize counts of turning-ON of the transistors 11 to 14, and 21 to 24. Therefore, generation of heat due to turning ON of the transistors 11 to 14 and 21 to 24 is equalized and dispersed, and thus functional decline of the transistors 11 to 14 and 21 to 24 due to the heat generation is prevented to be able to extend a life of the semiconductor integrated circuit.

FIG. 2 is a diagram schematically illustrating a configuration of a semiconductor chip 1 with which the semiconductor integrated circuit according to the first embodiment is integrated. Note that in the following, a configuration corresponding to the above-mentioned configuration is represented with same reference symbols and the description is omitted appropriately. The same applies hereafter. The semiconductor chip 1 includes a power-unit region 3 and a control-unit region 2.

The power-unit region 3 includes regions A11 to A14 in which the transistors 11 to 14 are respectively formed, and regions B21 to B24 in which the transistors 21 to 24 are respectively formed. In other words, the transistor 11 is formed in the region A11, and the transistor 21 is formed in the region B21. The regions A11, A13, B21, and B23, in which the transistors 11, 13, 21, and 23 whose drains are connected to the voltage source 600 are formed, are arranged in line on an upper-portion side of the power-unit region 3, in other words, a region side in which the pad P3 connected to the voltage source 600 is formed. The regions A12, A14, B22, and B24, in which the transistors 12, 14, 22, and 24 whose sources are grounded are formed, are arranged in line on a lower-portion side of the power-unit region 3.

The output end 10-1 is formed in a bonding part of the region A11 and the region A12. Similarly, the output ends 10-2, 20-1, and 20-2 are formed in respective bonding parts of the regions A13 and A14, the regions B21 and B22, and the regions B23 and B24.

The pads P10 to P13 and the pad P3 are arranged in line on an upper-portion side of the semiconductor chip 1. The output ends 10-1, 10-2, 20-1, and 20-2 are respectively connected to the pads P10, P11, P12, and P13 by using predetermined wires (not illustrated).

The control-unit region 2 includes the PWM control circuit 40 and the mode set circuit 50. The control-unit region 2 includes an input end CT to which a control signal CTL, supplied from the outside via a pad P1, is applied, and an input end CL to which a clock signal CLK, supplied from the outside via a pad P2, is applied. The input ends CT and CL are respectively connected to the pads P1 and P2 by using predetermined wires (not illustrated). For example, the control signal CTL is supplied to the mode set circuit 50 and the PWM control circuit 40 to be used as a control signal for controlling a value of the excitation current. For example, the clock signal CLK is used as a synchronous signal for controlling a timing when the PWM controlling circuit 40 generates a PWM signal.

According to the present embodiment, the transistors 11 to 14 and 21 to 24 constituting the H-switches are integrated with the power-unit region 3. In other words, at least one of four sides surrounding a region in which the transistor is formed is in contact with a region in which another transistor is formed. Thus, timings are controlled at which the transistors 11 to 14 and 21 to 24 are turned ON, and thus heat generated in a region whose transistor is in an ON-state is able to be dissipated via a region whose transistor is in an OFF-state.

FIGS. 3A to 3F are diagrams illustrating examples of drive modes set by the mode set circuit 50. The semiconductor integrated circuit according to the first embodiment includes the A-phase side and the B-phase side, the A-phase side and the B-phase side are controlled by drive modes that are similar to each other, and thus the A-phase side will be explained as an example. ON/OFF states of the transistors 11 to 14 and flows of current are illustrated in FIGS. 3A to 3F.

Figure 3A:
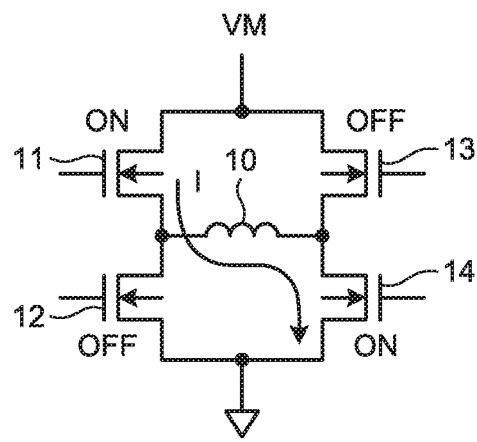
FIGS. 3A to 3F are diagrams illustrating drive modes of the semiconductor integrated circuit according to the first embodiment.
Figure 3D:
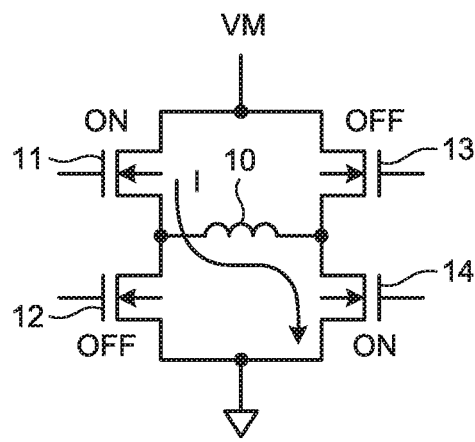
Figure 3B:
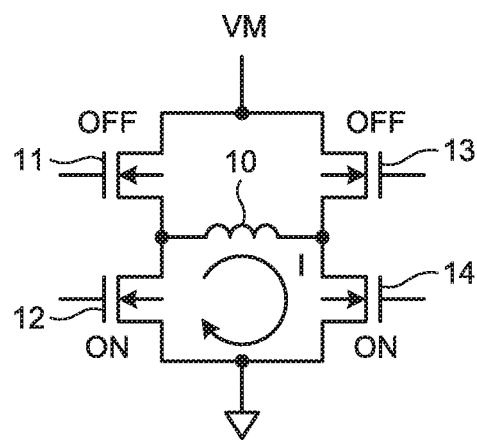
Figure 3E:
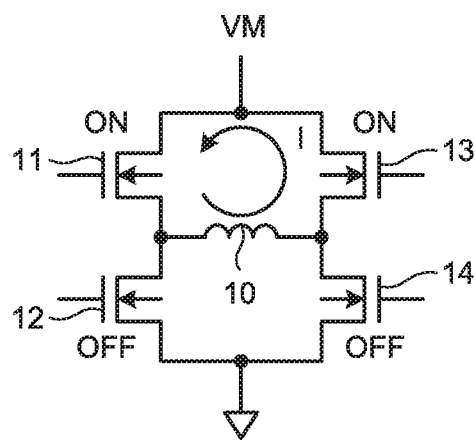
Figure 3C:
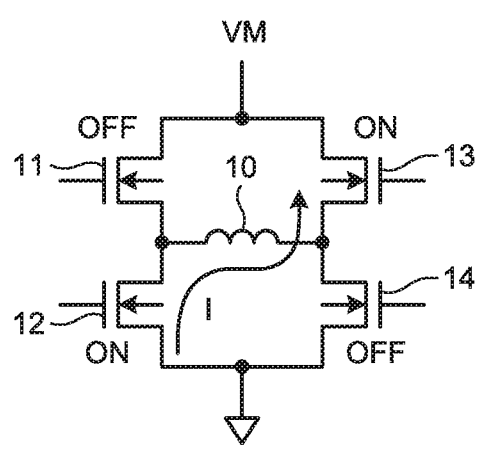
Figure 3F:
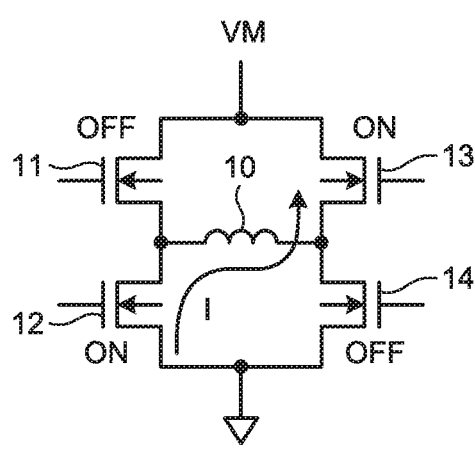

In FIG. 3A, there is illustrated a state in which the transistors 11 and 14 are in an ON-state. The state indicates a charge mode in which current flows into the exciting coil 10 from a side of the voltage source 600 that supplies the voltage VM. In FIG. 3B, there is illustrated a state in which the transistors 12 and 14 are in an ON-state. The state indicates a D-mode in which a charge of the exciting coil 10 is discharged at a low speed with reference to a ground potential. In FIG. 3C, there is illustrated a state in which the transistors 12 and 13 are in an ON-state. The state indicates a high-speed discharge mode in which current flows from the exciting coil 10 in a direction from a ground side to the voltage source 600 so as to discharge a charge of the exciting coil 10 at a high speed. In FIG. 3D, there is illustrated a charge mode which is similar to that illustrated in FIG. 3A. In FIG. 3E, there is illustrated a state in which the transistors 11 and 13 are in an ON-state. The state indicates a U-mode in which a charge of the exciting coil 10 is discharged at a low speed with reference to a power-source voltage VM. In FIG. 3F, there is illustrated a high-speed discharge mode similar to that illustrated in FIG. 3C.

The exciting coil 10 is excited by repetition of the series of drive modes illustrated in FIGS. 3A to 3F so as to drive the rotor 100.

FIGS. 4A and 4B are diagrams illustrating effects of the semiconductor integrated circuit according to the first embodiment. FIG. 4A illustrates transistors turned into an ON-state in the series of drive modes A to F illustrated in FIGS. 3A to 3F. A transistor in at least one region, which is in contact with a region whose transistor is in an ON-state, is in an OFF-state. Therefore, heat generated from the transistor in an ON-state is able to be dissipated via a region whose transistor is in an OFF-state. Thus, it is possible to effectively dissipate the generated heat.

In FIG. 4B, there is illustrated totalization results of the number of times that each of the transistors 11 to 14 and 21 to 24 is turned ON by the series of controls in the drive modes A to F. The number of times that each of the transistors 11 to 14 and 21 to 24 is turned ON is averaged to be three. Therefore, heat generation due to an ON-state is averaged. In other words, the series of controls includes the U-mode and the D-mode, and thus the number of times that each of the transistors 11 to 14 and 21 to 24 is turned ON is able to be averaged. The heat generation by the transistors 11 to 14 and 21 to 24 is averaged, and thus concentration of heat is avoided to reduce functional decline in the transistors 11 to 14 and 21 to 24 due to the generated heat, so that it is possible to extend a life of the semiconductor integrated circuit device. Note that the U-mode and the D-mode are alternately executed in the series of controls, for example.

Second Embodiment

Figure 5:
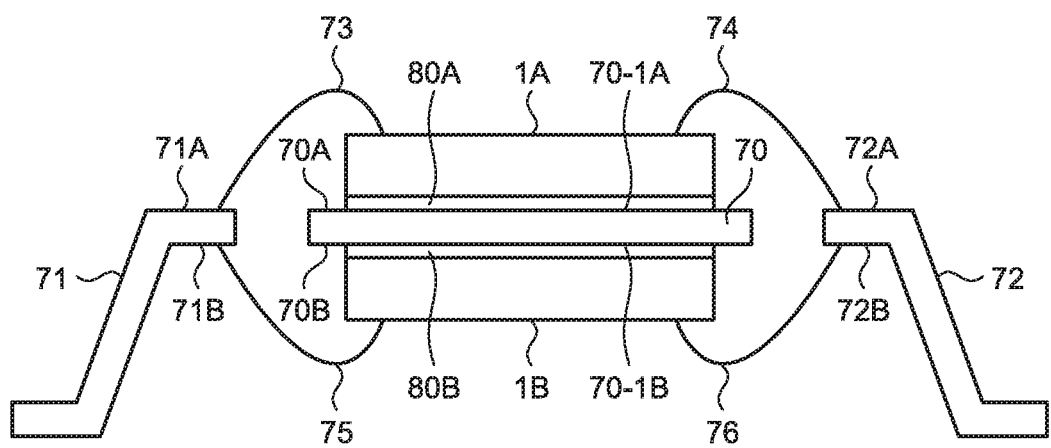
FIG. 5 is a side view schematically illustrating a configuration of a semiconductor integrated circuit device according to a second embodiment.

FIG. 5 is a side view schematically illustrating a configuration of a semiconductor integrated circuit device according to a second embodiment. The semiconductor integrated circuit device according to the present embodiment includes a semiconductor chip 1A arranged on an upper surface 70A side of a die pad 70 made of metal, and a semiconductor chip 1B arranged on a lower surface 70B side opposite to the upper surface 70A. The semiconductor chip 1B is arranged on the lower surface 70B side of the die pad 70 and is operated in parallel with the semiconductor chip 1A, so that it is possible to provide a semiconductor integrated circuit device having a high driving capability. Heat generated from the semiconductor chips 1A and 1B are effectively dissipated by the die pad 70. There is provided a resin that seals therein the semiconductor chips 1A and 1B, bonding wires 73 and 74, and inner portions of leads 71 and 72 of the semiconductor integrated circuit device; however, illustration thereof is omitted.

The semiconductor chip 1A is mounted on a mounting part 70-1A of the upper surface 70A of the die pad 70 by an adhesive agent 80A. The pads (not illustrated) formed in the semiconductor chip 1A are connected to connection parts 71A and 72A on the upper side of the leads 71 and 72 by the bonding wires 73 and 74.

The semiconductor chip 1B is mounted on a mounting part 70-1B of the lower surface 70B of the die pad 70 by an adhesive agent 80B. The pads (not illustrated) formed in the semiconductor chip 1B are connected to connection parts 71B and 72B on the lower side of the leads 71 and 72 by the bonding wires 75 and 76.

Figure 6:
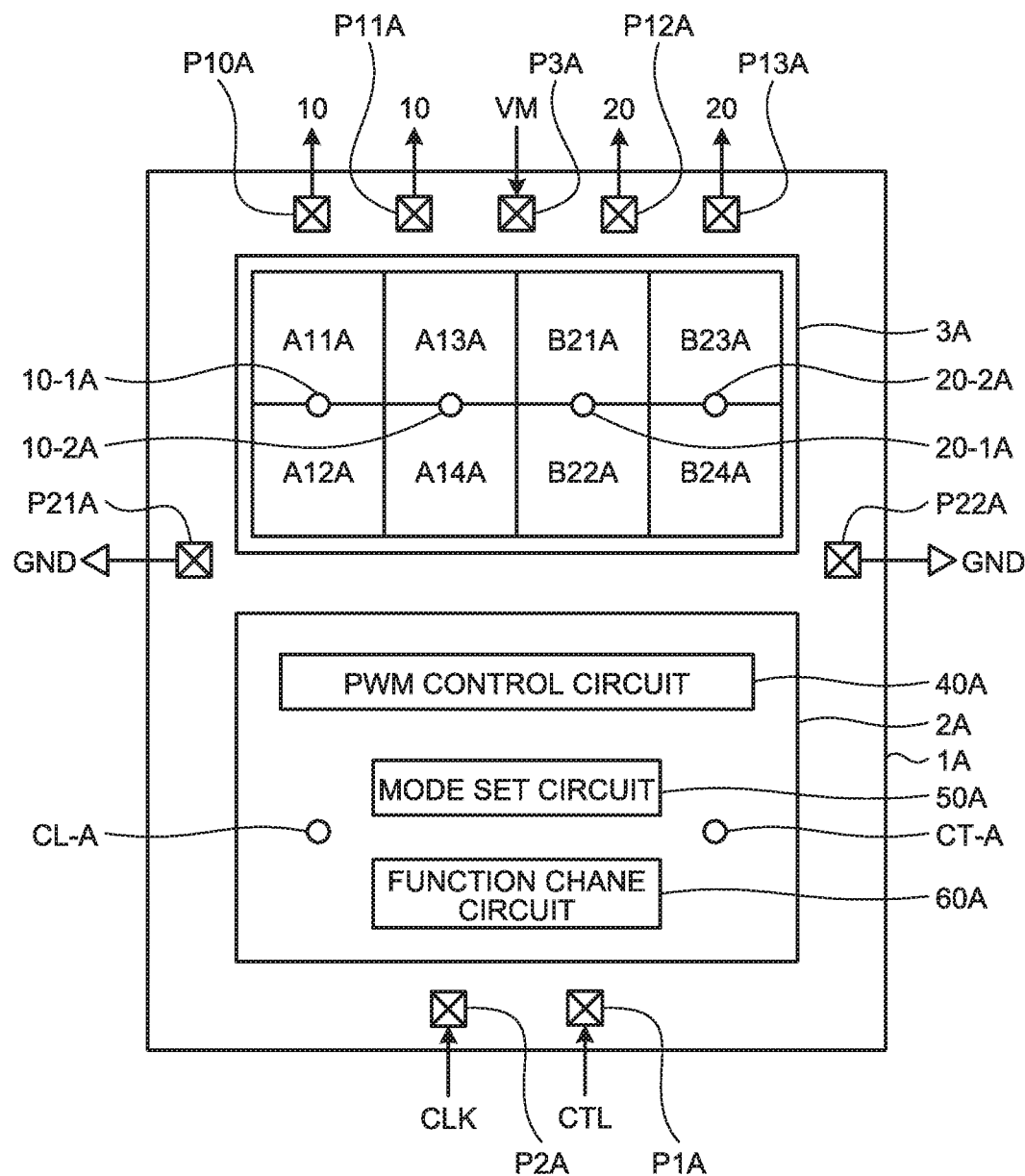
FIG. 6 is a diagram schematically illustrating a configuration of a first semiconductor chip of the semiconductor integrated circuit device according to the second embodiment.

FIG. 6 is a diagram schematically illustrating a configuration of the semiconductor chip 1A. The semiconductor chip 1A has a configuration similar to that of the semiconductor chip 1 according to the first embodiment. Corresponding configuration elements are indicated by adding "A" to their reference symbols. The semiconductor chip 1A further includes a function change circuit 60A. The function change circuit 60A has functions for switching connections between "input ends CL-A and CT-A" and "pads P1A and P2A", and connections between output ends "10-1A, 10-2A, 20-1A, and 20-2A" and "pads P10A, P11A, P12A, and P13A".

Figure 7:
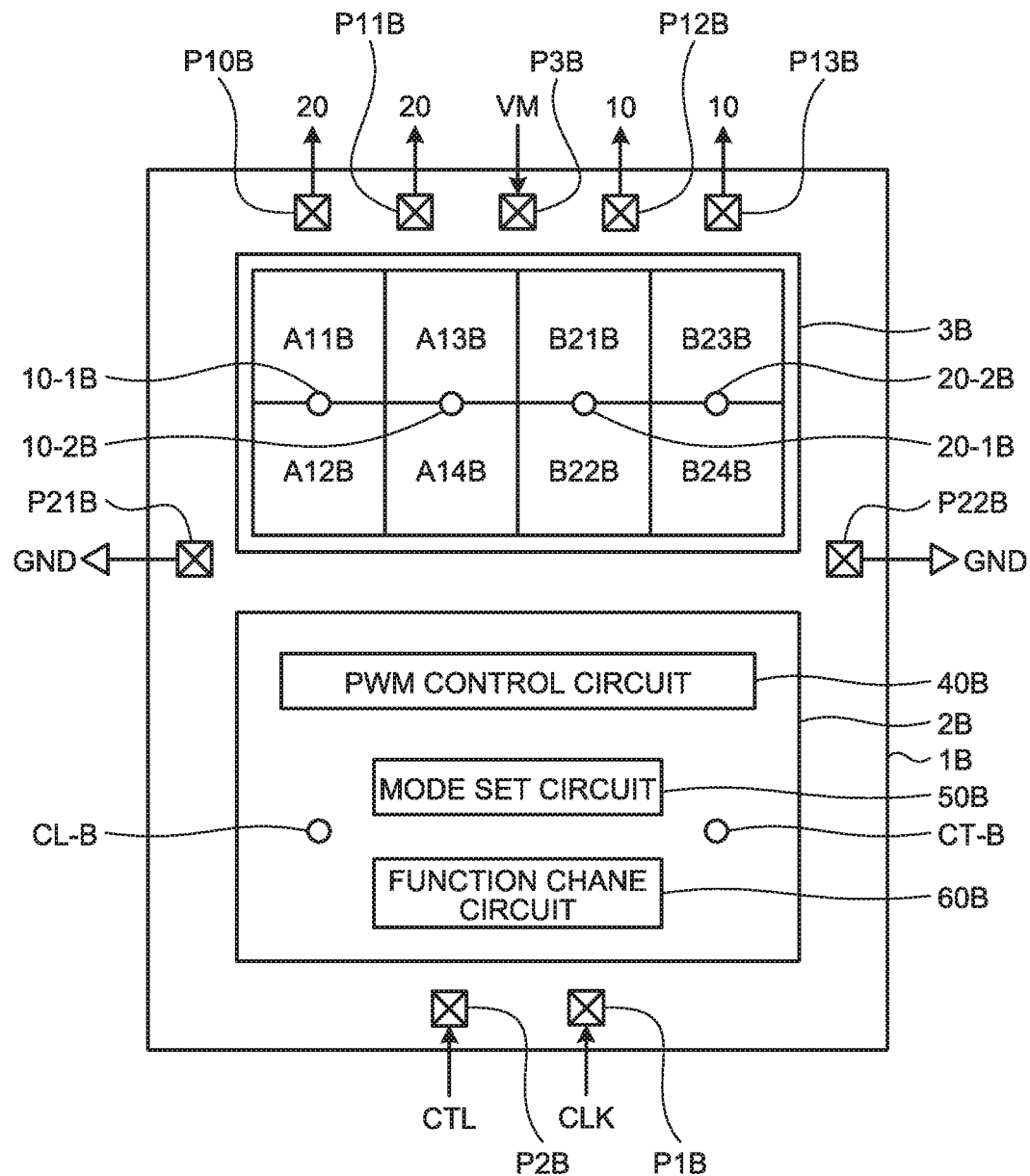
FIG. 7 is a diagram schematically illustrating a configuration of a second semiconductor chip of the semiconductor integrated circuit device according to the second embodiment.

FIG. 7 is a diagram schematically illustrating a configuration of the semiconductor chip 1B. Similarly to the semiconductor chip 1A, the semiconductor chip 1B has a configuration similar to that of the semiconductor chip 1 according to the first embodiment. Corresponding configuration elements are indicated by adding "B" to their reference symbols. The semiconductor chip 1B further includes a function change circuit 60B. The function change circuit 60B has functions for switching connections between "input ends CL-B and CT-B" and "pads P1B and P2B", and connections between output ends "10-1B, 10-2B, 20-1B, and 20-2B" and "pads P10B, P11B, Pl2B, and P13B".

Figure 8A:
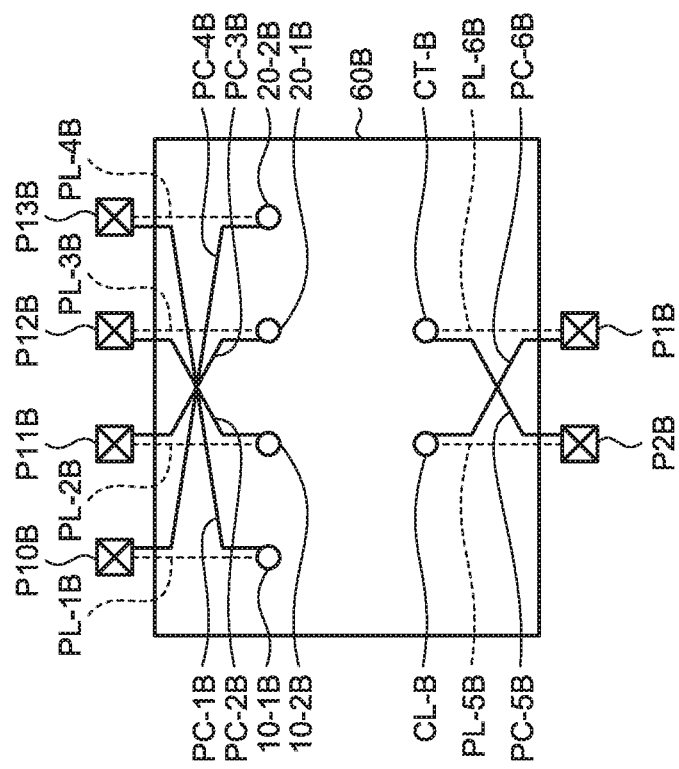
FIGS. 8A and 8B are diagrams schematically illustrating a configuration of a function change circuit.
Figure 8B:
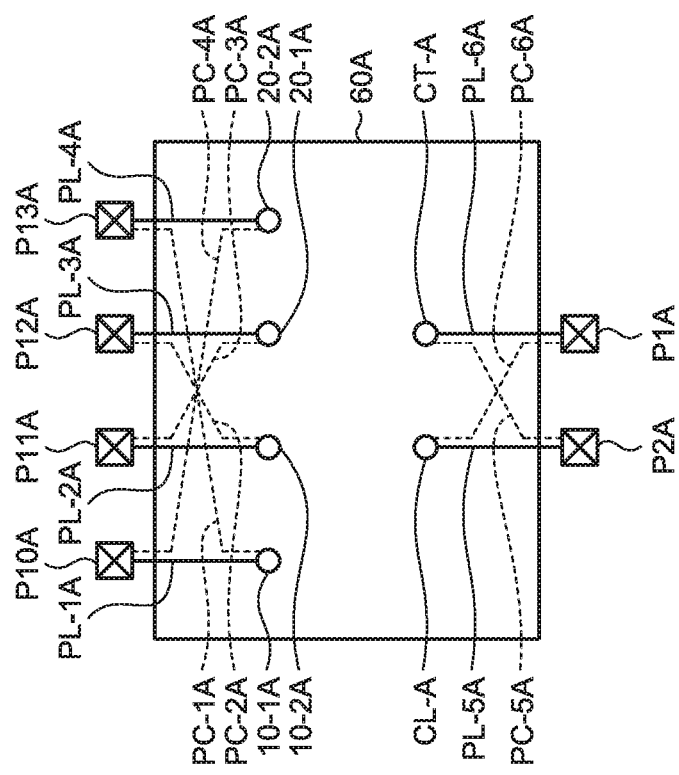

FIGS. 8A and 8B are diagrams schematically illustrating connection relations of wires by the function change circuits 60A and 60B. A solid line indicates a connected state, and a dashed line indicates a shut-off state. Connection relations of each of the wires in the function change circuits 60A and 60B are corresponding to each other. An example of connection relation by the function change circuit 60A is illustrated in FIG. 8A. The function change circuit 60A has connection routes PL-1A to PL-6A and PC-1A to PC-6A. The function change circuit 60A changes a function of the semiconductor chip 1A by setting the connection routes PL-1A to PL-6A and PC-1A to PC-6A to a connection state or to a shut-off state.

The pad P1A is connected to the input end CT-A, and the pad P2A is connected to the input end CL-A. The output end 10-1A, the output end 10-2A, the output end 20-1A, and the output end 20-2A are respectively connected to the pad P10A, the pad P11A, the pad P12A, and the pad P13A. The connection routes PC-1A to PC-6A are shut off. Note that illustration of a pad P3A and pads P21A and P22A is omitted.

An example of connection relation by the function change circuit 60B is illustrated in FIG. 8B. The function change circuit 60B has connection routes PL-1B to PL-6B and PC-1B to PC-6B. The function change circuit 60B changes a function of the semiconductor chip 1B by setting the connection routes PL-1B to PL-6B and PC-1B to PC-6B to a connection state or to a shut-off state.

The pad P1B is connected to the input end CL-B, and the pad P2B is connected to the input end CT-B. The output end 10-1B, the output end 10-2B, the output end 20-1B, and the output end 20-2B are respectively connected to the pad P13B, the pad P12B, the pad P11B, and the pad P10B. The connection routes PL-1B to PL-6B are shut off. In other words, connection relation in the function change circuit 60A and connection relation in the function changing circuit 60B are changed in such a manner that connection ends are exchanged between the left portion and the right portion while interposing the pad P3A and the pad P3B as a center. Note that illustration of the pad P3B to which the power-source voltage VM is supplied and grounded pads P21B and P22B is omitted.

Figure 9:
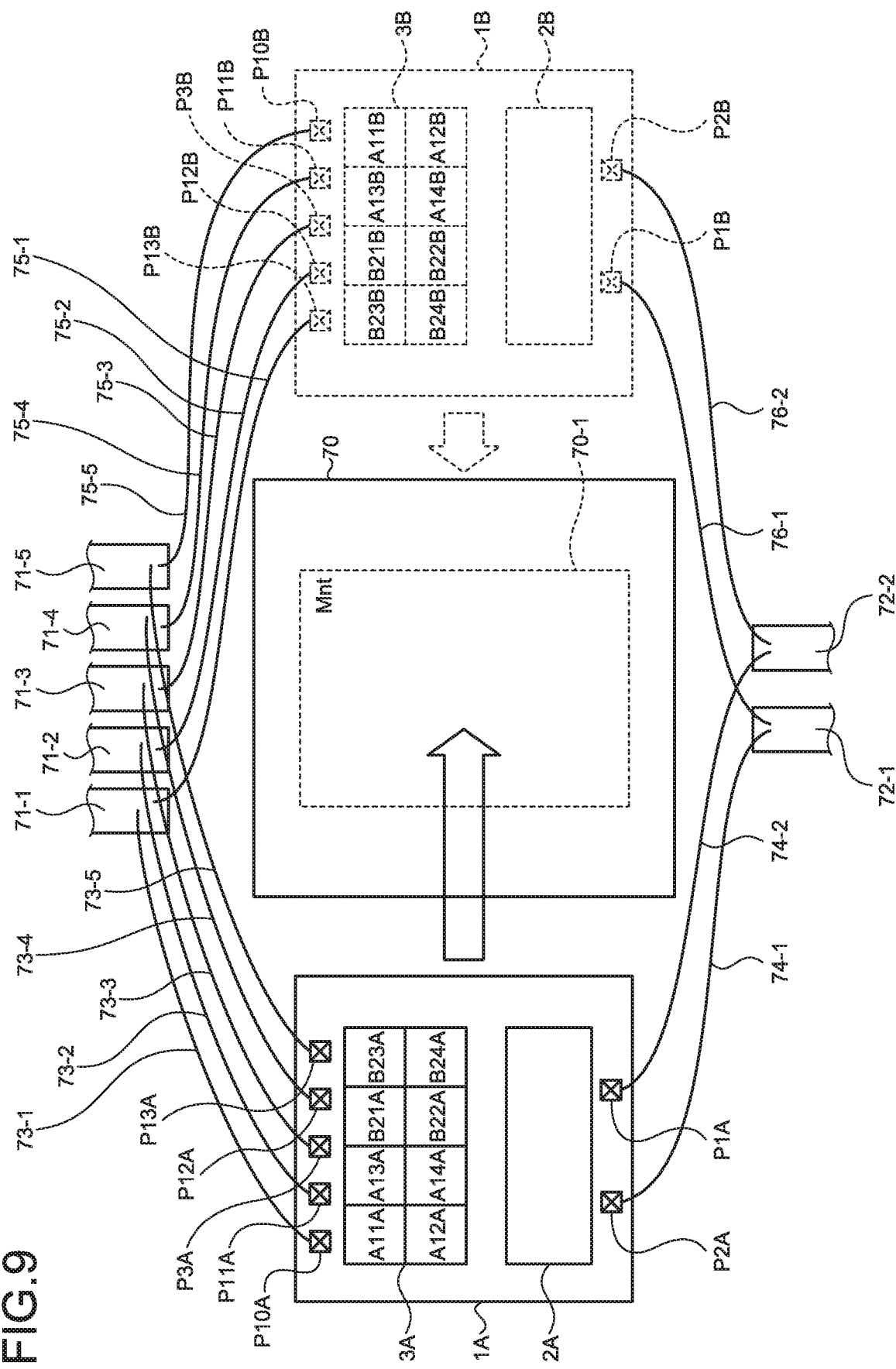
FIG. 9 is a plan view schematically illustrating a configuration of the semiconductor integrated circuit device according to the second embodiment.

FIG. 9 is a plan view schematically illustrating a configuration in which the semiconductor chips 1A and 1B are respectively arranged on both surfaces of the die pad 70. For convenience of explanation, the semiconductor chip 1A arranged on the upper side of a mounting part 70-1 of the die pad 70 and the semiconductor chip 1B arranged on the lower side of the die pad 70 are two-dimensionally illustrated, and thus the semiconductor chips 1A and 1B are illustrated in such a manner that they are separated from the die pad 70.

The semiconductor chip 1B is arranged under the lower-side surface of the die pad 70, and thus the semiconductor chip 1B is illustrated by using dashed lines for convenience of explanation.

The clock signal CLK is supplied from a lead 72-1 that is common to the semiconductor chips 1A and 1B, and the control signal CTL is supplied from a lead 72-2 that is common to the semiconductor chips 1A and 1B, so that it is possible to execute, in common, synchronization and control of operations of PWM control circuits 40A and 40B, and those of mode set circuits 50A and 50B, which are integrated with the semiconductor chips 1A and 1B. Thus, parallel operation of the semiconductor chips 1A and 1B is realized, so that it is possible to increase driving capability of the semiconductor integrated circuit device.

The function change circuit 60A is constituted of the connection relation illustrated in FIG. 8A, and the function change circuit 60B is constituted of the connection relation illustrated in FIG. 8B. The semiconductor chip 1B is upset and arranged such that its reverse face is in contact with the die pad 70. Thus, the semiconductor chip 1B is arranged in a state where left and right of positions of the pads formed in the semiconductor chip 1B are reversed with respect to positions of the pads formed in the semiconductor chip 1A. In other words, when viewed from the upper side in perspective, the pad P10A of the semiconductor chip 1A is located on the left side, on the other hand, the pad P10B of the semiconductor chip 1B is located on the right side. In other words, the pad P13B of the semiconductor chip 1B is located in a position corresponding to the pad P10A of the semiconductor chip 1A while interposing the die pad 70 therebetween.

The pad P10A is connected to a lead 71-1 by a wire 73-1, and the pad P13B is connected to the lead 71-1 by a wire 75-1. The pad P13B is changed into a function originally corresponding to the pad P10B by the function change circuit 60B, and thus supplies an output from the output end 10-1B. In other words, the pad P13B supplies an output corresponding to that of the output end 10-1A of the semiconductor chip 1A. Thus, the pad P10A and the pad P13B are connected to the lead 71-1, and thus outputs from the semiconductor chip 1A and the semiconductor chip 1B are summed up, so that it is possible to obtain a configuration that improves driving capability. The same applies to the other pads P10B to P12B.

The pad P13B is arranged in a position corresponding to the pad P10A. Thus, the lead 71-1 is close to the pads P10A and P13B, so that it is possible to reduce lengths of the wires 73-1 and 75-1. The same applies to other wires 73-2 to 73-5, 75-2 to 75-5, 74-1, 74-2, 76-1, and 76-2.

By employing a configuration in which the function change circuits 60A and 60B change connection relation between "the pads P1A, P2A, P10A to P13A, P21A, P22A, P1B, P2B, P10B to P13B, P21B, and P22B" and "ends CT-B, CL-B, 10-1B, 10-2B, 20-1B, 20-2B" so as to change the function, it is possible to arrange the semiconductor chips 1A and 1B, having the same configuration, on both respective surfaces of the common die pad 70 and further to execute parallel driving. In other words, it is possible to provide a semiconductor integrated circuit device whose driving capability is improved. When semiconductor chips having the same configuration are prepared as the semiconductor chips 1A and 1B, there can be provided semiconductor integrated circuit device in which the semiconductor chips 1A and 1B are arranged on respective upper and lower surfaces of the die pad 70 so as to be operated in parallel as long as connection relations in the function change circuits 60A and 60B are changed, so that it is possible to reduce the cost of design and manufacturing.

Each of the function change circuits 60A and 60B may have a configuration in which a corresponding connection relation is changed by whether the connection route is connected or shut off as needed. For example, each of the function change circuits 60A and 60B may be constituted of a programmable device such as an eFuse to be electrically programed. In accordance with whether a semiconductor chip having such a configuration is arranged on the upper side or the lower side of the die pad 70, configurations of the function change circuits 60A and 60B are able to be easily changed by programming. Or, each of the function change circuits 60A and 60B may have a configuration that changes its connection relation by trimming of whether or not a wire (not illustrated) formed on the semiconductor chips 1A and 1B is cut.

FIGS. 10A to 10C are diagrams illustrating effects of the semiconductor integrated circuit device according to the second embodiment. In FIG. 10A, there are illustrated drive modes of the semiconductor chip 1A and transistors that are turned ON in accordance with each of the drive modes. In FIG. 10B, there are illustrated drive modes of the semiconductor chip 1B and transistors that are turned ON in accordance with each of the drive modes.

In FIG. 10C, there is illustrated a totalization results of the number of times that each of the transistors 11 to 14 and 21 to 24 is turned ON by the series of controls in the drive modes A to F. As illustrated in FIG. 10C, in the series of controls of the drive mode A to F, the number of times that each of the transistors 11 to 14 and 21 to 24 of the semiconductor chips 1A and 1B is turned ON is averaged to be three. Therefore, heat generation due to an ON-state is averaged and dispersed. In other words, the series of controls includes the U-mode and the D-mode, and thus the number of times that each of the transistors 11 to 14 and 21 to 24 is turned ON is able to be averaged. Thus, generated heat is dispersed to prevent functional decline in the transistors 11 to 14 and 21 to 24, so that it is possible to extend a life of the semiconductor integrated circuit device. Note that the U-mode and the D-mode are alternately executed in the series of controls, for example.

The semiconductor chip 1A has the series of drive modes of the drive modes A to F, on the other hand, the semiconductor chip 1B has the drive mode E instead of the drive mode B. In other words, the U-mode and the D-mode are exchanged between the semiconductor chip 1A and the semiconductor chip 1B. Thus, when the semiconductor chip 1A on the upper side of the die pad 70 is in the U-mode, the semiconductor chip 1B operates in the D-mode, and thus regions in which heat is generated are different. According to the above-mentioned control, it is possible to more effectively disperse heat.

The semiconductor chips 1A and 1B are respectively arranged on the upper side and the lower side of the die pad 70 in an upset manner. Thus, regions A11A to A14A and B21A to B24A of the semiconductor chip 1A and regions A11B to A14B and B21B to B24B of the semiconductor chip 1B that are arranged on the lower surface 70B side have a line-symmetric relation with respect to center axes of the semiconductor chips 1A and 1B. Therefore, for example, when the semiconductor chips 1A and 1B operate in the same drive mode A, positions of regions of transistors that are turned ON are different between the semiconductor chips 1A and 1B. In other words, at the lower surface 70B side of the die pad 70 corresponding to the region A11A of the transistor 11 that is turned ON in the semiconductor chip 1A, the region B23B of the transistor 23 in an OFF-state is located. Thus, regions generating heat are dispersed, so that it is possible to avoid concentration of heat.

The drive transistor is exemplified as an NMOS transistor; however, not limited thereto. For example, the transistors 11, 13, 21, and 23 arranged on the power end side may be constituted of PMOS transistors. Furthermore, the switching element may be constituted of a power element such as a GaN transistor and an Insulated Gate Bipolar Transistor (IGBT) having a function of a high withstanding voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first switching element whose main current path is connected to a first output end and a power end therebetween, the first output end supplying excitation current to a first exciting coil of a motor;
   a second switching element whose main current path is connected to the first output end and a first grounding end therebetween;
   a third switching element whose main current path is connected to a second output end and the power end therebetween, the second output end supplying excitation current to the first exciting coil;
   a fourth switching element whose main current path is connected to the second output end and the first grounding end therebetween;
   a mode set circuit that sets a drive mode of the first to fourth switching elements; and
   a control circuit that generates, in accordance with the drive mode, drive signals for controlling turning ON/OFF of the first to fourth switching elements, and supplies the generated drive signals to the first to fourth switching elements, wherein
   the drive mode includes:
      a first discharge mode that turns ON the first switching element and the third switching element; and
      a second discharge mode that turns ON the second switching element and the fourth switching element.

2. The semiconductor integrated circuit according to claim 1, wherein
   the first discharge mode and the second discharge mode are alternately executed.

3. The semiconductor integrated circuit according to claim 1, further comprising:
   a fifth switching element whose main current path is connected to a third output end and the power end therebetween, the third output end supplying excitation current to a second exciting coil of the motor;
   a sixth switching element whose main current path is connected to the third output end and a second grounding end therebetween;
   a seventh switching element whose main current path is connected to a fourth output end and the power end therebetween, the fourth output end supplying excitation current to the second exciting coil; and
   an eighth switching element whose main current path is connected to the fourth output end and the second grounding end therebetween, wherein
   the mode set circuit sets a drive mode of the fifth to eighth switching elements,
   the control circuit generates, in accordance with the drive mode, drive signals for controlling turning ON/OFF of the fifth to eighth switching elements, and supplies the generated drive signals to the fifth to eighth switching element, and
   the drive mode includes:
      a third discharge mode that turns ON the fifth switching element and the seventh switching element; and
      a fourth discharge mode that turns ON the sixth switching element and the eighth switching element.

4. The semiconductor integrated circuit according to claim 3, wherein
   the third discharge mode and the fourth discharge mode are alternately executed.

5. The semiconductor integrated circuit according to claim 3, further comprising:
   a first pad connected to one end of the first exciting coil;
   a second pad connected to another end of the first exciting coil; a third pad connected to one end of the second exciting coil;
   a fourth pad connected to another end of the second exciting coil; and
   a function change circuit that changes connections between the first to fourth output ends and the first to fourth pads.

6. A semiconductor integrated circuit device comprising:
   a first semiconductor chip with which the semiconductor integrated circuit according to claim 5 is integrated, the first semiconductor chip being arranged on a first principal surface of a die pad; and
   a second semiconductor chip with which the semiconductor integrated circuit according to claim 5 is integrated, the second semiconductor chip being arranged on a second principal surface opposite to the first principal surface of the die pad.

7. The semiconductor integrated circuit device according to claim 6, wherein
   the first to fourth pads are arranged in line near one of sides of the first semiconductor chip.

8. The semiconductor integrated circuit device according to claim 6, wherein
   the first semiconductor chip includes a first power region,
   the first, third, fifth, and seventh switching elements are arranged in line in an upper portion of the first power region, and
   the second, fourth, sixth, and eighth switching elements are arranged in line in a lower portion of the first power region.

9. The semiconductor integrated circuit device according to claim 6, wherein
   the first, third, fifth, and seventh switching elements of the first semiconductor chip simultaneously turn ON at a first timing, and
   the second, fourth, sixth, and eighth switching elements of the second semiconductor chip simultaneously turn ON at the first timing.

10. The semiconductor integrated circuit device according to claim 6, wherein
    the first semiconductor chip includes:
       a first control signal end to which a control signal to be supplied to a control circuit of the first semiconductor chip is applied;

a first synchronous signal end to which a synchronous signal to be supplied to the control circuit of the first semiconductor chip is applied;
a first control signal pad to which the control signal is supplied from an outside; and
a first synchronous signal pad to which the synchronous signal is supplied from an outside,
the function change circuit of the first semiconductor chip is configured to:
connect the first control signal end and the first control signal pad with each other; and
connect the first synchronous signal end and the first synchronous signal pad with each other,
the second semiconductor chip includes:
a second control signal end to which the control signal to be supplied to a control circuit of the second semiconductor chip is applied;
a second synchronous signal end to which the synchronous signal to be supplied to the control circuit of the second semiconductor chip is applied;
a second synchronous signal pad to which the control signal to be supplied to the control circuit of the second semiconductor chip is supplied from an outside; and
a second control signal pad to which the synchronous signal to be supplied to the control circuit of the second semiconductor chip is supplied from an outside, and
a function change circuit of the second semiconductor chip connects the second control signal end and the second synchronous signal pad with each other, and connects the second synchronous signal end and the second control signal pad with each other.

11. The semiconductor integrated circuit device according to claim 7, further comprising:
a first lead to which each of the first pad of the first and the second semiconductor chip is connected;
a second lead to which each of the second pad of the first and the second semiconductor chip is connected;
a third lead to which each of the third pad of the first and the second semiconductor chip is connected; and
a fourth lead to which each of the fourth pad of the first and the second semiconductor chip is connect.

12. A motor-drive control system comprising:
a motor including an exciting coil that generates magnetic field by excitation current; and
a semiconductor integrated circuit device that controls the excitation current, wherein
the semiconductor integrated circuit device includes:
a first switching element whose main current path is connected to a first output end and a power end therebetween, the first output end supplying excitation current to a first exciting coil of the motor;
a second switching element whose main current path is connected to the first output end and a grounding end therebetween;
a third switching element whose main current path is connected to a second output end and the power end therebetween, the second output end supplying excitation current to the first exciting coil;
a fourth switching element whose main current path is connected to the second output end and the grounding end therebetween;
a first mode set circuit that sets a drive mode of the first to fourth switching elements; and
a first control circuit that generates, in accordance with the drive mode, drive signals for controlling turning ON/OFF of the first to fourth switching elements, and supplies the generated drive signals to the first to fourth switching elements, wherein
the drive mode includes:
a first discharge mode that turns ON the first switching element and the third switching element; and
a second discharge mode that turns ON the second switching element and the fourth switching element.

13. The motor-drive control system according to claim 12, wherein
the first discharge mode and the second discharge mode are alternately executed.

14. The motor-drive control system according to claim 13, wherein
the semiconductor integrated circuit device includes:
a fifth switching element whose main current path is connected to a third output end and the power end therebetween, the third output end supplying excitation current to a second exciting coil of the motor;
a sixth switching element whose main current path is connected to the third output end and a second grounding end therebetween;
a seventh switching element whose main current path is connected to a fourth output end and the power end therebetween, the fourth output end supplying excitation current to the second exciting coil; and
an eighth switching element whose main current path is connected to the fourth output end and the second grounding end therebetween, wherein
the first mode set circuit sets a drive mode of the fifth to eighth switching elements,
the first control circuit generates, in accordance with the drive mode, drive signals for controlling turning ON/OFF of the fifth to eighth switching elements, and supplies the generated drive signals to the fifth to eighth switching elements, and
the drive mode includes:
a third discharge mode that turns ON the fifth switching element and the seventh switching element; and
a fourth discharge mode that turns ON the sixth switching element and the eighth switching element.

15. The motor-drive control system according to claim 14, wherein
the third discharge mode and the fourth discharge mode are alternately executed.

16. The motor-drive control system according to claim 14, wherein
the first and third discharge modes are simultaneously executed, and
the second and fourth discharge modes are simultaneously executed at a timing different from a timing at which the first and third discharge modes are executed.

17. The motor-drive control system according to claim 14, further comprising;
a first semiconductor chip arranged on a first principal surface of a die pad; and
a second semiconductor chip arranged on a second principle surface opposite to the first principal surface of the die pad, wherein
the first semiconductor chip includes the first to eighth switching elements, the first mode set circuit, and the first control circuit, and
the second semiconductor chip includes ninth to sixteenth switching elements corresponding to the first to eighth switching elements, a second mode set circuit corresponding to the first mode set circuit, and a second control circuit corresponding to the first control circuit.

18. The motor-drive control system according to claim 17, wherein
the first control circuit turns ON the first, third, fifth, and seventh switching elements at a first timing, and
the second control circuit turns ON the tenth, twelfth, fourteenth, sixteenth switching elements at the first timing.

19. A semiconductor integrated circuit device comprising:
a first semiconductor chip arranged on a first principal surface of a die pad, the first semiconductor chip including:
  a first switching element whose main current path is connected to a first output end and a first power end therebetween, the first output end supplying excitation current to a first exciting coil of a motor;
  a second switching element whose main current path is connected to the first output end and a first grounding end therebetween;
  a third switching element whose main current path is connected to a second output end and the first power end therebetween, the second output end supplying excitation current to the first exciting coil;
  a fourth switching element whose main current path is connected to the second output end and the first grounding end therebetween;
  a first mode set circuit that sets a drive mode of the first to fourth switching elements;
  a first control circuit that generates, in accordance with the drive mode set by the first mode set circuit, drive signals for controlling turning ON/OFF of the first to fourth switching elements, and supplies the generated drive signals to the first to fourth switching elements;
  a first control signal end to which a control signal to be supplied to the first control circuit is applied;
  a first synchronous signal end to which a synchronous signal to be supplied to the first control circuit is applied;
  a first control signal pad to which the control signal to be supplied to the first control circuit is supplied from an outside;
  a first synchronous signal pad to which the synchronous signal to be supplied to the first control circuit is supplied from an outside; and
  a first function change circuit that changes a connection relation between the first control signal end and the first control signal pad, or a connection relation between the first control signal end and the first synchronous signal pad, and a connection relation between the first synchronous signal end and the first synchronous signal pad, or a connection relation between the first synchronous signal end and the first control signal pad; and
a second semiconductor chip arranged on a second principal surface opposite to the first principal surface of the die pad, the second semiconductor chip including:
  a fifth switching element whose main current path is connected to a third output end and a second power end therebetween, the third output end supplying excitation current to the first exciting coil;
  a sixth switching element whose main current path is connected to the third output end and a second grounding end therebetween;
  a seventh switching element whose main current path is connected to a fourth output end and the second power end therebetween, the fourth output end supplying excitation current to the first exciting coil;
  an eighth switching element whose main current path is connected to the fourth output end and the second grounding end therebetween;
  a second mode set circuit that sets a drive mode of the fifth to eighth switching elements;
  a second control circuit that generates, in accordance with the drive mode set by the second mode set circuit, drive signals for controlling turning ON/OFF of the fifth to eighth switching elements, and supplies the generated drive signals to the fifth to eighth switching elements;
  a second control signal end to which the control signal to be supplied to the second control circuit is applied;
  a second synchronous signal end to which the synchronous signal to be supplied to the second control circuit is applied;
  a second control signal pad to which the control signal to be supplied to the second control circuit is supplied from an outside;
  a second synchronous signal pad to which the synchronous signal to be supplied to the second control circuit is supplied from an outside; and
  a second function change circuit that changes a connection relation between the second control signal end and the second control signal pad, or a connection relation between the second control signal end and the second synchronous signal pad, and a connection relation between the second synchronous signal end and the second synchronous signal pad, or a connection relation between the second synchronous signal end and the second control signal pad.

20. The semiconductor integrated circuit device according to claim 19, wherein
the drive mode set by the first mode set circuit includes:
  a first discharge mode that turns ON the first switching element and the third switching element; and
  a second discharge mode that turns ON the second switching element and the fourth switching element, and
the drive mode set by the second mode set circuit includes:
  a third discharge mode that turns ON the fifth switching element and the seventh switching element; and
  a fourth discharge mode that turns ON the sixth switching element and the eighth switching element.

* * * * *